United States Patent
Lin et al.

(10) Patent No.: US 7,362,192 B1
(45) Date of Patent: Apr. 22, 2008

(54) LOW NOISE VOLTAGE-CONTROLLED OSCILLATOR

(75) Inventors: Li Lin, Saratoga, CA (US); Thomas B. Cho, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 68 days.

(21) Appl. No.: 11/282,342

(22) Filed: Nov. 18, 2005

(51) Int. Cl.
*H03B 5/12* (2006.01)

(52) U.S. Cl. .......................... 331/117 FE; 331/117 R; 331/36 C; 331/177 V

(58) Field of Classification Search ............... 331/36 C, 331/117 R, 117 FE, 177 V
See application file for complete search history.

(56) References Cited

U.S. PATENT DOCUMENTS

| | | | |
|---|---|---|---|
| 4,631,652 A | 12/1986 | Wendt | |
| 5,629,652 A * | 5/1997 | Weiss | 331/108 B |
| 5,734,307 A * | 3/1998 | Mannerstråle et al. | 333/219 |
| 6,639,481 B1 * | 10/2003 | Ravi et al. | 331/177 V |
| 6,690,244 B2 * | 2/2004 | Mernyei et al. | 331/117 R |
| 6,876,266 B2 | 4/2005 | Koo et al. | |
| 6,888,417 B2 | 5/2005 | Moon et al. | |
| 6,906,596 B2 * | 6/2005 | Kitamura et al. | 331/36 C |
| 6,911,870 B2 | 6/2005 | Gierkink et al. | |
| 6,927,643 B2 | 8/2005 | Lazarescu et al. | |
| 7,154,349 B2 * | 12/2006 | Cabanillas | 331/117 R |
| 2003/0095458 A1 | 5/2003 | Park et al. | |
| 2004/0196110 A1 | 10/2004 | Boccuzzi et al. | |
| 2004/0251978 A1 | 12/2004 | Muramatsu et al. | |
| 2005/0122177 A1 | 6/2005 | Ikarashi | |

OTHER PUBLICATIONS

Wilkin, J. (Nov. 21, 2001). "Voltage Controlled Oscillators," University of Toronto, Canada, 14 pages.

* cited by examiner

*Primary Examiner*—Robert J. Pascal
*Assistant Examiner*—Levi Gannon

(57) ABSTRACT

Oscillator circuits for reducing phase noise are described in this disclosure. In one embodiment, an oscillator circuit includes a pair of cross-coupled transistors, including a first transistor and a second transistor, a first inductor in communication with a control terminal of the first transistor and an output terminal of the second transistor, a second inductor in communication with a control terminal of the second transistor and an output terminal of the first transistor, and a tank circuit in communication with the first inductor and the second inductor, where the tank circuit comprises a tank inductor and a variable capacitor.

34 Claims, 8 Drawing Sheets

LOW NOISE VOLTAGE-CONTROLLED OSCILLATOR

FIELD OF THE INVENTION

The present invention relates to the field of integrated circuits. In particular, the present invention relates to low noise voltage-controlled oscillator (VCO) circuits.

BACKGROUND

Voltage-controlled oscillator circuits are well known in the art, and may be generally described as circuits which generate an output signal, the frequency of which is determined by connecting a tank or resonant circuit. VCO circuits are important circuits in today's electronics as they form the crucial building blocks in larger circuits such as frequency synthesizers, modulators, demodulators, and clock recovery circuits typically employed in numerous telecommunication products.

In many instances, the performance of these telecommunications devices is limited by the VCO's phase noise, which can be generally described as the random variation in the phase or frequency of the output signal. In other words, the phase noise places a limit on how precisely the output frequency of the VCO can be generated. Phase noise in the output signal from the VCO can also result in cross-talk and increase bit error rates in digital systems. This loss in accuracy translates into errors in the transmission and reception of information.

FIG. 1 illustrates a prior art VCO circuit for reducing phase noise. As shown in FIG. 1, an inductor-capacitor (LC) tank circuit is employed to reduce the phase noise of the VCO. The LC tank includes inductors $L_1$ and $L_2$, variable capacitors $C_1$ and $C_2$, and a pair of cross-coupled transistors $M_1$ and $M_2$. The transistors $M_1$ and $M_2$ are biased by a bias current IB and a capacitor CS. The differential output signals are present at nodes $V_1$ and $V_2$.

The VCO circuit shown in FIG. 1 has several problems. First, the quality factor (Q) of the on-chip passive inductors $L_1$ and $L_2$ is limited. High Q inductors are necessary for reducing the phase noise of the VCO circuit of FIG. 1. One method for obtaining high Q inductors is to use gold-plated bond-wire to achieve high Q for the on-chip inductors $L_1$ and $L_2$. However, this solution is expensive. Another problem of the VCO circuit of FIG. 1 is that the voltage swing between gate and source of the transistors $M_1$ and $M_2$ is limited to the voltage swing of the output signals at $V_1$ and $V_2$, which is limited to the supply of the circuit. Because of this voltage swing limitation, the VCO circuit of FIG. 1 is more susceptible to phase noise than a VCO circuit that has a large voltage differential between the gate and the drain terminal. Hence, there is a need for a VCO circuit that exhibits improved phase noise performance.

SUMMARY

In accordance with an embodiment of this disclosure, an improved oscillator circuit includes a pair of cross-coupled transistors, including a first transistor and a second transistor, a first inductor in communication with a control terminal of the first transistor and an output terminal of the second transistor, a second inductor in communication with a control terminal of the second transistor and an output terminal of the first transistor, and a tank circuit in communication with the first inductor and the second inductor, where the tank circuit comprises a tank inductor and a variable capacitor.

This oscillator circuit has been found to reduce phase noise significantly by separating the gate and drain terminal voltages of each of the cross-coupled transistors so that the voltage applied to each gate terminal can have a swing larger than the voltage applied to the drain of that transistor. The phase noise is reduced by the relatively larger resulting gate voltage. The amount of the extra voltage swing at the gate terminals of each of the two transistors is controlled through the inductance ratio between the tank inductor and the first and second inductors. This oscillator circuit has been found to result in reduced phase noise together with less power consumption.

In another embodiment, an oscillator circuit includes a first pair of cross-coupled transistors having a first metal oxide semiconductor (MOS) transistor and a second MOS transistor, a second pair of cross-coupled transistors having a third MOS transistor and a fourth MOS transistor, where a first pair of control terminals of the first MOS and third MOS transistors are coupled together, and a second pair of control terminals of the second MOS and fourth MOS transistors are coupled together. The oscillator further includes a first inductor in communication with the first pair of control terminals of the first MOS and third MOS transistors and output terminals of the second MOS and fourth MOS transistors, a second inductor in communication with the second pair of control terminals of the second MOS and fourth MOS transistors and output terminals of the first MOS and third MOS transistors, and a tank circuit in communication with the first inductor and the second inductor, where the tank circuit comprises a tank inductor and a variable capacitor.

In yet another embodiment, a method for operating an oscillator circuit having a first transistor and a second transistor forming a cross-coupled pair of transistors includes coupling a first inductor between a control terminal of the first transistor and an output terminal of the second transistor, coupling a second inductor between a control terminal of the second transistor and an output terminal of the first transistor, and coupling a tank circuit between the first inductor and the second inductor, where the tank circuit comprises a tank inductor and a variable capacitor. The tank circuit enables a first mutual inductance between the first inductor and the tank inductor, and it enables a second mutual inductance between the tank inductor and the second inductor. The method further includes adjusting inductance values of the first inductor, the second inductor, the tank inductor, and capacitance values of the variable capacitor to obtain a desired phase noise level at a particular resonance frequency of the oscillator circuit.

In yet another embodiment, a system for generating a pair of low phase noise differential output signals, with an oscillating circuit having a first transistor and a second transistor forming a cross-coupled pair of transistors, includes a first inductive means for inductively coupling a control terminal of the first transistor to an output terminal of the second transistor, a second inductive means for inductively coupling a control terminal of the second transistor to an output terminal of the first transistor, and a third inductive means for inductively coupling the first inductive means to the second inductive means, where the third inductive means enables mutual inductances between the first inductive means and the second inductive means. The system also includes means for supplying power to the oscillator circuit, means for producing a voltage differential across the oscillator circuit, means for supplying a first reference current to the output terminal of the first transistor, and means for supplying a second reference current to the output terminal of the second transistor. In one approach, the first inductive means, the second inductor means, and the third inductor means may be implemented by a first inductor, a second inductor, and a tank inductor respectively. The means for producing a voltage difference across the oscillator circuit may be implemented by applying a power supply voltage (Vdd) and a reference circuit ground voltage (Gnd) across the oscillator circuit. The means for supplying a first reference current and a second reference current may be implemented by a first reference current source and a second reference current source respectively.

The system further includes means for adjusting the mutual inductances between the first inductive means, the second inductive means, and the third inductive means to obtain a desired phase noise level at a particular resonance frequency of the oscillator circuit. In addition, the system includes means for generating a first output signal of the oscillator circuit, and means for generating a second output signal of the oscillator circuit, where the first output signal and the second output signal are approximately 180 degrees out of phase. In one approach, the means for adjusting the mutual inductances may be implemented by control signals that can adjust the inductances of the first, second, and third inductive means respectively. The means for generating the first and second differential output signals are implemented by controllably switching the first and second transistors of the oscillator circuit.

DETAILED DESCRIPTION

The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1:
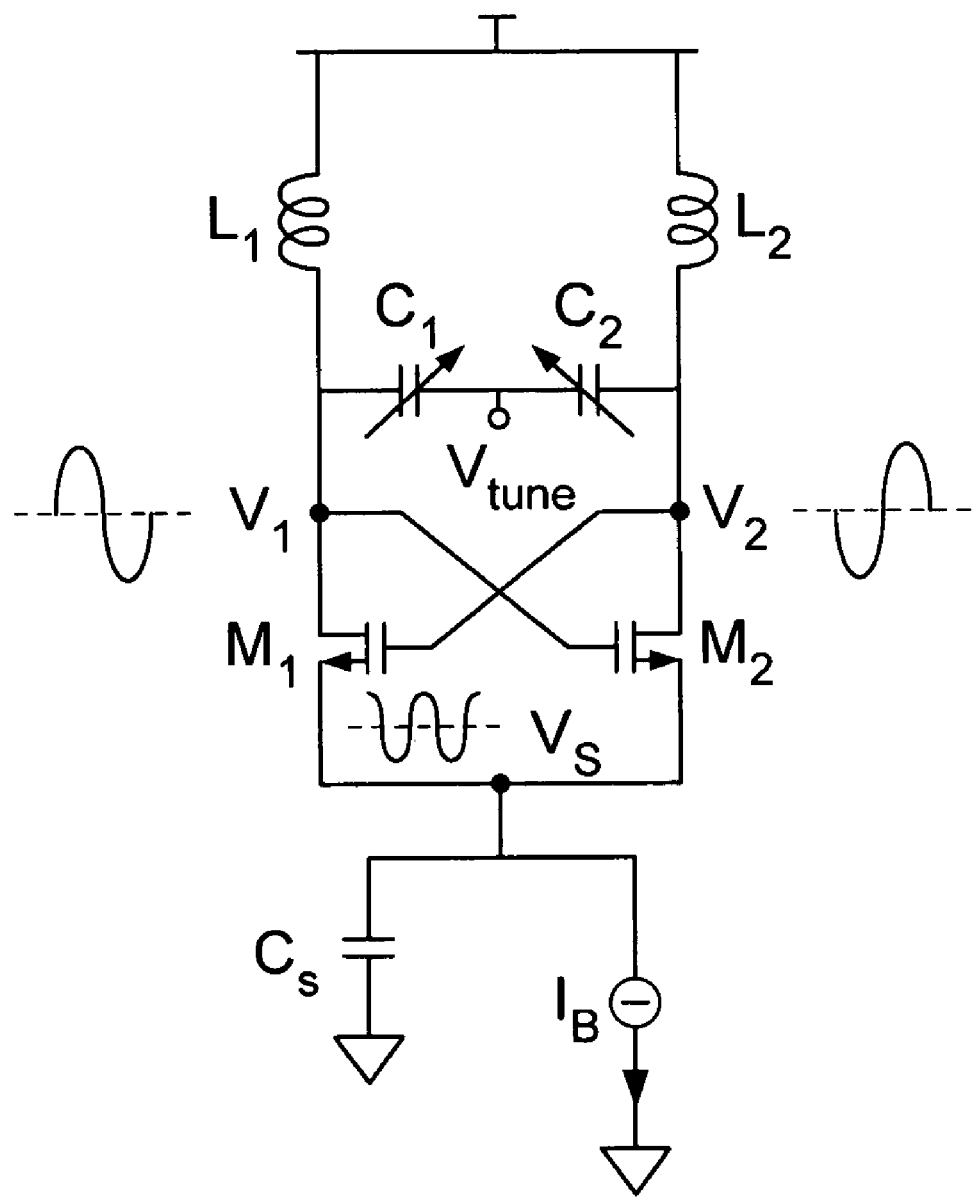
FIG. 1 illustrates a prior art VCO circuit for reducing phase noise.
Figure 2:
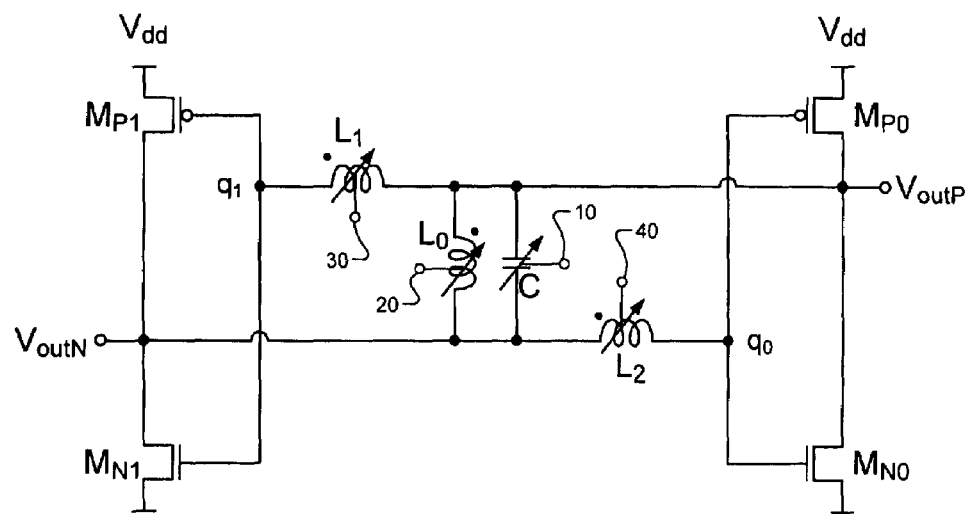
FIG. 2 illustrates a low phase noise VCO circuit according to an embodiment of the present invention.

FIG. 2 illustrates a low phase noise VCO circuit according to an embodiment of the present invention. In this embodiment, the VCO circuit is formed with four transistors in two pairs, the first pair being cross-coupled transistors $M_{P1}$ and $M_{P0}$, both of positive (P) conductivity type. There is also provided a second pair of cross-coupled transistors $M_{N1}$ and $M_{N0}$, both of N type. These conductivity types are not limiting. In certain embodiments as described below in association with FIGS. 3a and 3b, only one such pair of cross-coupled transistors is required. The provision of two transistor pairs has been found to provide better phase noise reduction than the use of only one pair of cross-coupled transistors. The gate terminals of $M_{P1}$ and $M_{N1}$ are coupled together and this node is labeled $q_1$. Similarly, the gate terminals of transistors $M_{P0}$ and $M_{N0}$ are coupled together and this node is labeled $q_0$. In this cross-coupled VCO circuit, a control signal applied at node $q_1$ would render transistor $M_{P1}$ conductive and would render transistor $M_{N1}$ non-conductive, and vice versa. Similarly, a control signal applied at node $q_0$ would render transistor $M_{P0}$ conductive and would render transistor $M_{N0}$ non-conductive, and vice versa.

As shown, an LC tank circuit is coupled between the output nodes $V_{outP}$ and $V_{outN}$. The LC tank circuit produces a high parallel resistance for enabling a large voltage swing at the gate terminals of the transistor pairs $\{M_{P1}, M_{N1}\}$ and $\{M_{P0}, M_{N1}\}$ respectively. The LC tank circuit includes inductor $L_0$ and a variable capacitor C. A first terminal of the LC tank circuit is coupled via a first inductor $L_1$ to the gate (control) terminals of transistors $M_{P1}$ and $M_{N1}$ at node q1. In addition, a second terminal of the LC tank circuit is coupled via a second inductor $L_2$ to the gate terminals of transistors $M_{P0}$ and $M_{N1}$ at node q0. As shown, the resonance frequency of the LC tank circuit is tunable by use of the parallel-coupled variable capacitor (varactor) C. This is accomplished by coupling in parallel varactor C to inductor $L_0$ and applying a biasing control voltage to the control terminal 10 of varactor C, which in turn effectively adjusts the value of varactor C. In this implementation, inductors $L_1$ and $L_2$ may be variable, tunable, changeable, or merely be assigned particular values according to the design requirements of the VCO circuit. Note that the dots at respectively the left end of inductor $L_1$ and $L_2$, and at the upper end of inductor $L_0$ indicate the direction of coupling. These three inductors are inductively coupled together. The mutual inductance $M_{1\_0}$ between $L_1$ and $L_0$ is substantially the same as the mutual inductance $M_{2\_0}$ between $L_2$ and $L_0$. The self inductances of $L_1$ and $L_2$ are approximately the same. This is to ensure that the differential operation of the VCO and the waveforms have approximately 50% duty cycle. The mutual inductances $M_{1\_0}$, $M_{2\_0}$, and $M_{1\_2}$ (between $L_1$ and $L_2$), and the self inductances $L_0$, $L_1$, and $L_2$ are parameters that may be set to satisfy particular design requirements. The inductors $L_0$, $L_1$, and $L_2$ determine the resonance frequency and the amount of gate overdrive of the four transistors, which improves the phase noise of this VCO circuit. The inductors $L_0$, $L_1$, and $L_2$ have control inputs 20, 30, and 40, respectively.

The VCO output terminals for supplying the output signals at a desired frequency are $V_{outN}$ and $V_{outP}$. Signals generated at $V_{outN}$ and $V_{outP}$ are differential output signals that are 180 degrees out of phase but have the same frequency. There is no requirement that there be two such output signals and in other embodiments one of the output signals may be used. The source terminals of transistors $M_{P1}$ and $M_{P0}$ are coupled to a first supply voltage $V_{dd}$ and the source terminals of transistors $M_{N1}$ and $M_{N0}$ are coupled to another supply voltage and/or circuit ground.

The configuration shown in FIG. 2 is advantageous in using three inductors that separate the control (gate) and output (drain) terminals of the transistors. As a result, the gate voltage at nodes $q_1$ and $q_0$ can have larger swings than the voltage swings at the drain terminals $V_{outP}$ and $V_{outN}$ of the transistors. This is achieved by having inductor $L_1$ coupled between the nodes $q_1$ and $V_{outP}$, and having inductor $L_2$ coupled between the nodes $q_0$ and $V_{outN}$. Thereby, the phase noise of the VCO circuit is reduced through the application of the relatively larger control (gate) voltage swing to the control terminals at nodes $q_0$ and $q_1$. The relatively larger control voltage swing allows the transistors to turn on and turn off faster, and therefore reduces the duration (during switching of the transistors) the VCO circuit will be susceptible to phase noises.

Note that it is important to avoid reaching the breakdown voltage of the transistors. If voltage swing at the gate terminals is higher than the supply voltage $V_{dd}$, there is a likelihood of transistor breakdown, which may damage the transistors. In this implementation, high voltage devices are used in low voltage environment, such that the devices can tolerate higher gate-to-drain voltage ($V_{gd}$) and gate-to-source voltage ($V_{gs}$). In addition, the transistors shown in this example are field effect transistors. However, other types of transistors, such as bipolar transistors, may be used. In other embodiments, the VCO circuit may be embedded in an integrated circuit, or may be implemented as a set of discrete components or as a combination thereof with, for instance, some or all of the inductors and the varactor C being external components to an integrated circuit.

Figure 3A:
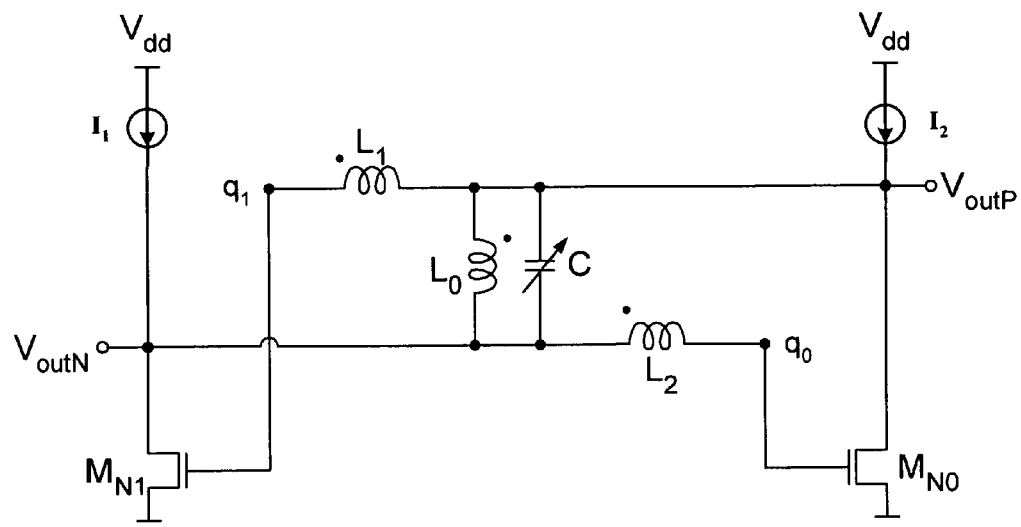
FIG. 3a illustrates a variation of the low phase noise VCO circuit of FIG. 2 according to an embodiment of the present invention.

FIG. 3a illustrates a variation of the low phase noise VCO circuit of FIG. 2 according to an embodiment of the present invention. In this embodiment, the transistors $M_{P1}$ and $M_{P0}$ of FIG. 2 are replaced by the reference current sources $I_1$ and $I_2$, respectively. The node $q_1$ is coupled to the gate terminal of transistor $M_{N1}$, and the node $q_0$ is coupled to the gate terminal of transistor $M_{N1}$. The rest of the circuit components are the same as in FIG. 2. This VCO circuit functions in a similar manner as the VCO circuit of FIG. 2 and is described above in association with FIG. 2.

Figure 3B:
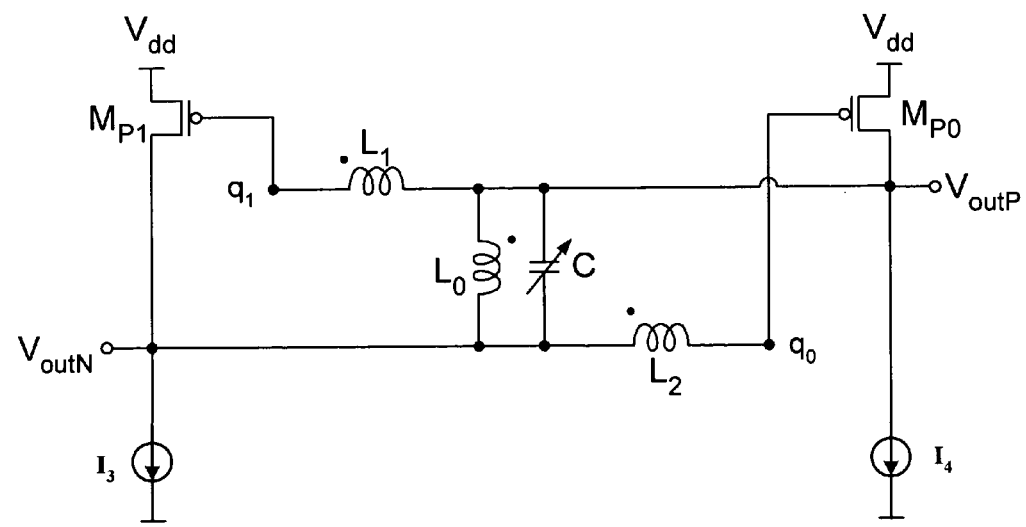
FIG. 3b illustrates another variation of the low phase noise VCO circuit of FIG. 2 according to an embodiment of the present invention.

FIG. 3b illustrates another variation of the low phase noise VCO circuit of FIG. 2 according to an embodiment of the present invention. Similarly in this embodiment, the transistors $M_{N1}$ and $M_{N1}$ of FIG. 2 are replaced by the reference current sources $I_3$ and $I_4$, respectively. The node $q_1$ is coupled to the gate terminal of transistor $M_{P1}$, and the node $q_0$ is coupled to the gate terminal of transistor $M_{P0}$. The rest of the circuit components are the same as in FIG. 2. This VCO circuit functions in a similar manner as the VCO circuit of FIG. 2 and is described above in association with FIG. 2.

Note that voltage control signals may be employed to control the varactor C and the capacitance of junction capacitor and/or metal capacitor. Table 1 shows example experimental results of the VCO circuit of FIG. 2 according to embodiments of the present invention.

TABLE 1

| Vctrl1 (volt) | Vctrl2 (volt) | Resonance Frequency (GHz) | Average Current (mA) | Offset (MHz) | Phase Noise (dBc/Hz) |
|---|---|---|---|---|---|
| 1.2 | 1.2 | 2.194 | 4.42 | 0.1 | −109.4 |
|  |  |  |  | 0.4 | −124.2 |
|  |  |  |  | 3 | −143 |
|  |  |  |  | 20 | −159.7 |
| 1.2 | 0 | 2.183 | 4.413 | 0.1 | −109.4 |
|  |  |  |  | 0.4 | −124.3 |
|  |  |  |  | 3 | −143.1 |
|  |  |  |  | 20 | −159.9 |
| 0 | 0 | 1.61 | 6.952 | 0.1 | −109.2 |
|  |  |  |  | 0.4 | −125.6 |
|  |  |  |  | 3 | −145.8 |
|  |  |  |  | 20 | −162.9 |

Figure 4:
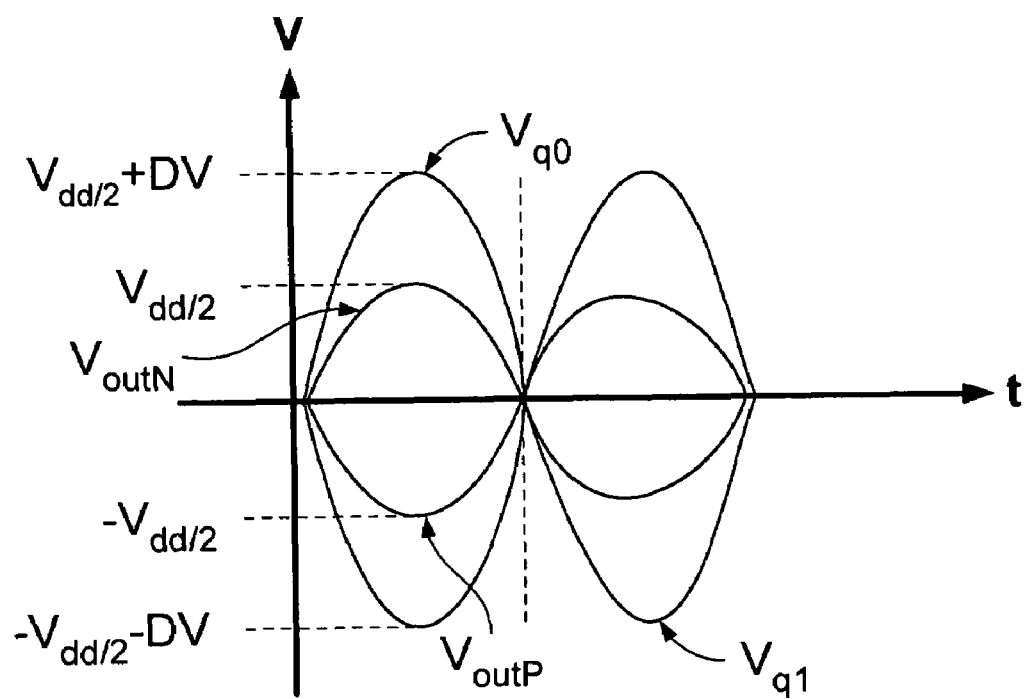
FIG. 4 illustrates waveforms of output signals generated by the VCO circuit of FIG. 2 according to embodiments of the present invention.

FIG. 4 illustrates waveforms of output signals generated by the VCO circuit of FIG. 2 according to embodiments of the present invention. As shown in FIG. 4, the output signals are in the form of Sine waves. Portions of several Sine waves are thereby shown with respect to the horizontal time axis t and the vertical voltage axis V. At the left, the upper-most wave form (with the largest envelope) is the voltage at node $q_0$ ($V_{q0}$). As shown this has a relatively large swing between its maximum positive value which is $V_{dd/2}+\Delta V$ and its maximum negative value which is $-V_{dd/2}-\Delta V$. The voltage at node $q_1$ ($V_{q1}$) has a similar swing. In contrast, the variations in the transistor drain terminal voltages are shown as the smaller amplitude Sine waves at nodes $V_{outN}$ and $V_{outP}$, respectively, which are shown as differential signals having 180 degrees of phase difference. Each drain terminal voltage has a voltage swing between $V_{dd/2}$ and $-V_{dd/2}$, substantially less than the voltage swing at the transistor gate terminals $q_0$, and $q_1$. The $V_{q1}$ signal is shown approximately 180 degrees out of phase with the $V_{q0}$ signal. This illustrates how the gate terminal voltage swing of the transistors is much larger than that at the drain terminals $V_{outN}$ and $V_{outP}$. Note that $V_{q0}$ and $V_{outP}$ are 180 degrees out of phase, likewise $V_{q1}$ and $V_{outN}$ are also 180 degrees out of phase. The voltage across gate and drain of each transistor can reach a voltage differential of $Vdd+\Delta V$.

The relevant parameters for this circuit (in addition to the value of $L_0$ as set by varactor C) for determining the output frequency are $M_{1\_2}$, $M_{1\_0}$, and $M_{2\_0}$, which are the mutual inductances between inductors $L_1$ and $L_2$, $L_1$ and $L_0$, and $L_2$ and $L_0$, respectively. Adjusting one or more of these parameters may change the resonance frequency and gate overdrive hence the phase noise of the VCO circuit. In some embodiments, various methods may be employed to realize the mutual inductance, for example, by interleaving the spiral turns, or by placing one inductor on top of the other for on-chip inductor implementations. In other embodiments, several methods may be used to realize the mutual inductance, for example, by making each $L_0$, $L_1$, and $L_2$ an element (coil) of a transformer, for off-chip inductor implementations.

Figure 5:
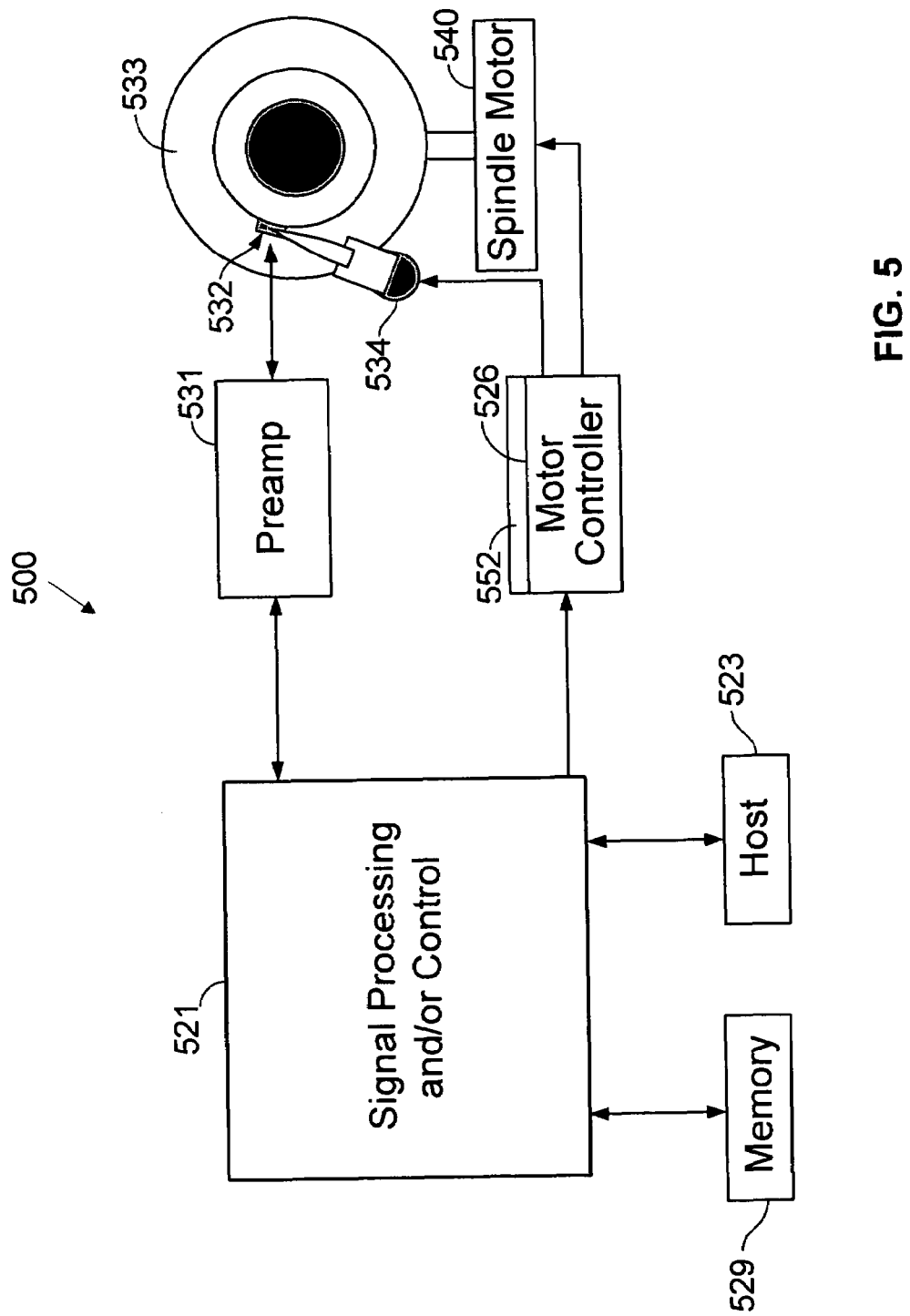
FIG. 5 is an illustrative block diagram of a hard disk drive (HDD) system that includes the disclosed VCO circuit in accordance with an embodiment of the invention.

FIG. 5 is an illustrative block diagram of a hard disk drive (HDD) system 500 that includes the disclosed VCO circuit in accordance with an embodiment of the invention. The disclosed VCO circuit (not shown) may be included in either or both signal processing and/or control circuitry 521. FIG.

2 illustrates example of uses of the disclosed VCO circuit applicable to the control circuitry 521. In some implementations, the signal processing and/or control circuitry 521 and/or other circuits (not shown) in the disk drive may process data, perform coding and/or encryption, perform calculations, and/or format data that is output to and/or received from a (magnetic) storage medium 533.

The disk drive may communicate with a host device 523 such as a computer, mobile computing devices such as personal digital assistants, cellular phones, media or MP3 players and the like, and/or other devices via one or more wired or wireless communication links. The disk drive may be connected to memory 529 such as random access memory (RAM), low latency nonvolatile memory such as flash memory, read only memory (ROM) and/or other suitable electronic data storage. Moreover, the signal processing and/or control circuits 521 may be implemented as a system-on-chip (SOC), and the memory 529 may be disposed on or off such SOC.

Figure 6:
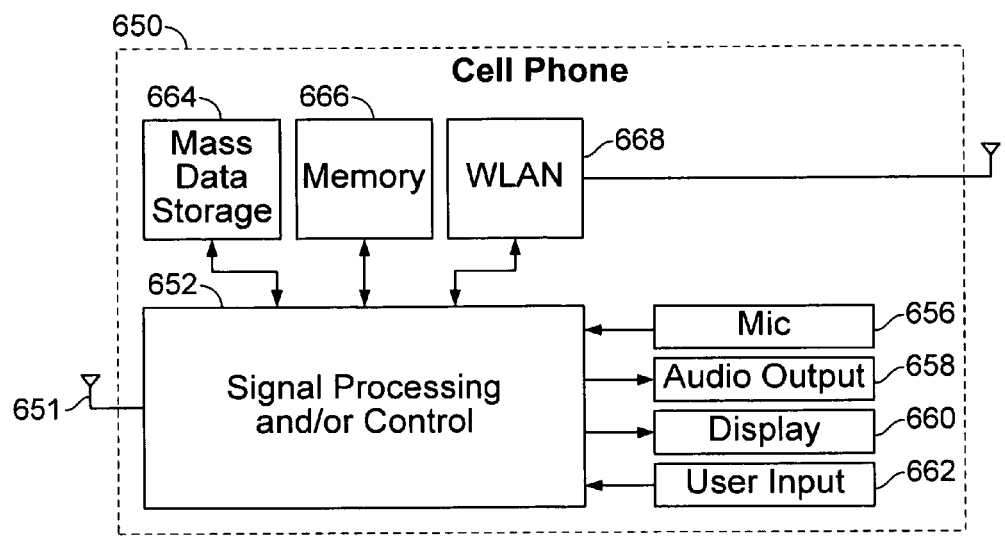
FIG. 6 is an illustrative block diagram of a cellular phone system that includes the disclosed VCO circuit in accordance with an embodiment of the invention.

FIG. 6 is an illustrative block diagram of a cellular phone system 650 that includes the disclosed VCO circuit in accordance with an embodiment of the invention. The cellular phone 650 includes a cellular antenna 651. Signal processing and/or control circuits 652 communicate with a WLAN interface and/or memory 666 or mass data storage 664 of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The control circuitry 652 includes the disclosed VCO circuit (not shown). FIG. 2 illustrates example of uses of the disclosed VCO circuit applicable to the control circuitry 652. The signal processing and/or control circuits 652 and/or other circuits (not shown) in the cellular phone 650 may process data, perform coding and/or encryption, perform calculations, format data and/or perform other cellular phone functions.

More particularly, the cellular phone 650 may communicate with mass data storage 664 that stores data in a nonvolatile manner such as optical and/or magnetic storage devices for example hard disk drives (HDD) and/or DVDs. At least one HDD may have the configuration shown in FIG. 5 and/or at least one DVD player may have the general configuration shown in FIG. 8. The HDD may be a mini HDD that includes one or more platters having a diameter that is smaller than approximately 1.8 inches. The cellular phone 650 may be connected to memory 666 such as RAM, ROM, low latency nonvolatile memory such as flash memory and/or other suitable electronic data storage. The cellular phone 650 also may support connections with a WLAN via a WLAN network interface 668.

Figure 7:
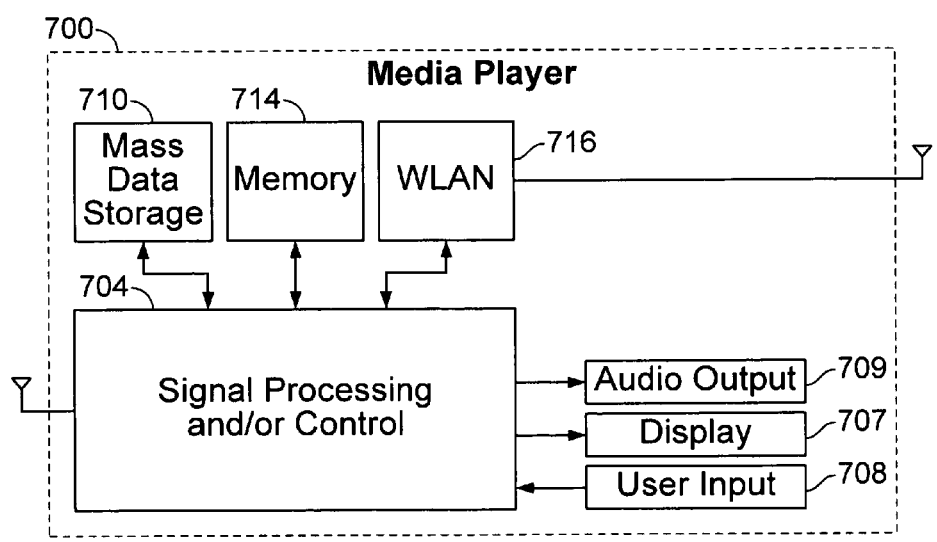
FIG. 7 is an illustrative block diagram of a media player that includes the disclosed VCO circuit in accordance with an embodiment of the invention.

FIG. 7 is an illustrative block diagram of a media player 700 that includes the disclosed VCO circuit in accordance with an embodiment of the invention. In one embodiment the media player may comprise an MP3 player, for example. The media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5 and/or at least one DVD may have the general configuration shown in FIG. 8. The HDD may be a mini HDD that includes one or more platters having a diameter that is smaller than approximately 1.8 inches. The media player 700 may be connected to memory 714 such as RAM, ROM, low latency nonvolatile memory such as flash memory and/or other suitable electronic data storage. The media player 700 also may support connections with a WLAN via a WLAN network interface 716. Still other implementations in addition to those described above are contemplated.

Signal processing and/or control circuits 704 communicate with a WLAN interface 716 and/or mass data storage 710 and/or memory 714 of the media player 700. The control circuitry 704 includes the disclosed VCO circuit (not shown). FIG. 2 illustrates example of uses of the disclosed VCO circuit applicable to the control circuitry 704. In some implementations, the media player 700 includes a display 707 and/or a user input 708 such as a keypad, touchpad and the like. In some implementations, the media player 700 may employ a graphical user interface (GUI) that typically employs menus, drop down menus, icons and/or a point-and-click interface via the display 707 and/or user input 708. The media player 700 further includes an audio output 709 such as a speaker and/or audio output jack. The signal processing and/or control circuits 704 and/or other circuits (not shown) of the media player 700 may process data, perform coding and/or encryption, perform calculations, format data and/or perform any other media player function.

Figure 8:
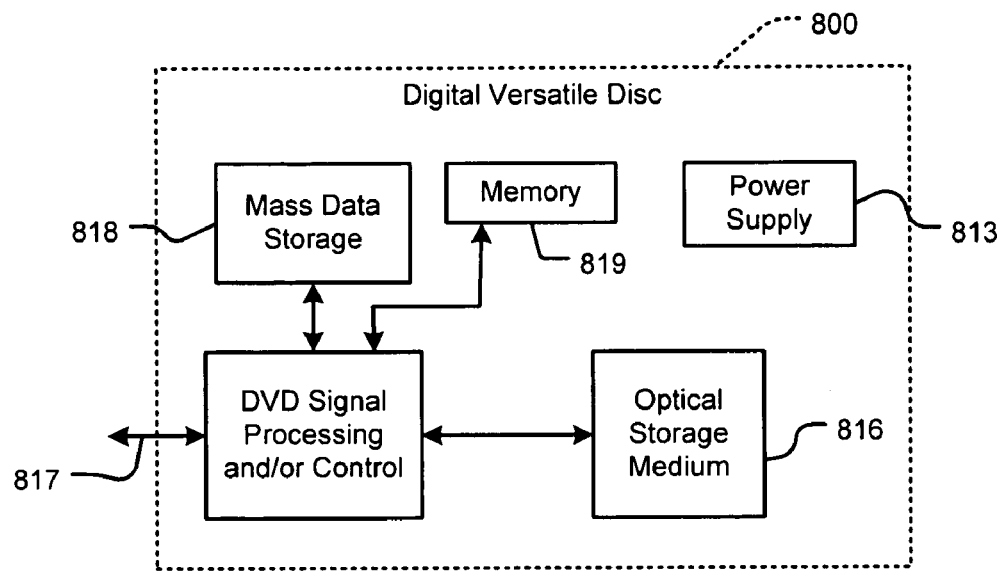
FIG. 8 is an illustrative block diagram of a digital versatile disk (DVD) drive that includes the disclosed VCO circuit in accordance with an embodiment of the invention.

FIG. 8 is an illustrative block diagram of a digital versatile disk (DVD) drive 800 that includes the disclosed VCO circuit in accordance with an embodiment of the invention. The disclosed VCO circuit may be implemented in either or both signal processing and/or control circuits, 812, mass data storage 818 and/or a power supply 813. The signal processing and/or control circuit 812 and/or other circuits (not shown) in the DVD 800 may process data, perform coding and/or encryption, perform calculations, and/or format data that is read from and/or data written to an optical storage medium 816. In some implementations, the signal processing and/or control circuit 812 and/or other circuits (not shown) in the DVD 800 can also perform other functions such as encoding and/or decoding and/or any other signal processing functions associated with a DVD drive.

The DVD drive 800 may communicate with an output device (not shown) such as a computer, television or other device via one or more wired or wireless communication links 817. The DVD 800 may communicate with mass data storage 818 that stores data in a nonvolatile manner. The mass data storage 818 may include a hard disk drive (HDD). The HDD may have the configuration shown in FIG. 5. The HDD may be a mini HDD that includes one or more platters having a diameter that is smaller than approximately 1.8 inches. The DVD 800 may be connected to memory 819 such as RAM, ROM, low latency nonvolatile memory such as flash memory and/or other suitable electronic data storage.

Figure 9:
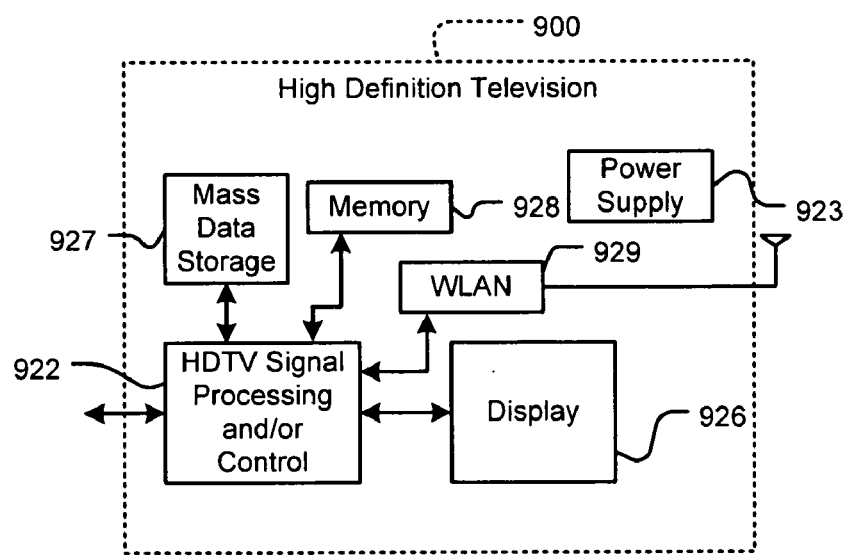
FIG. 9 is an illustrative block diagram of a high definition television (HDTB) that includes the disclosed VCO circuit in accordance with an embodiment of the invention.

FIG. 9 is an illustrative block diagram of a high definition television (HDTB) 900 that includes the disclosed VCO circuit in accordance with an embodiment of the invention. The disclosed VCO circuit may be implemented in either or both signal processing and/or control circuits, 922, a WLAN interface 929, mass data storage 927 and/or a power supply 923. The HDTV 900 receives HDTV input signals in either a wired or wireless format and generates HDTV output signals for a display 926. In some implementations, signal processing circuit and/or control circuit 900 and/or other circuits (not shown) of the HDTV 900 may process data, perform coding and/or encryption, perform calculations, format data and/or perform any other type of HDTV processing that may be required.

The HDTV 900 may communicate with mass data storage 927 that stores data in a nonvolatile manner such as optical and/or magnetic storage devices. At least one HDD may have the configuration shown in FIG. 5 and/or at least one DVD may have the configuration shown in FIG. 8. The HDD may be a mini HDD that includes one or more platters having a diameter that is smaller than approximately 1.8 inches. The HDTV 900 may be connected to memory 928 such as RAM, ROM, low latency nonvolatile memory such as flash memory and/or other suitable electronic data storage. The HDTV 900 also may support connections with a WLAN via a WLAN network interface 929.

Figure 10:
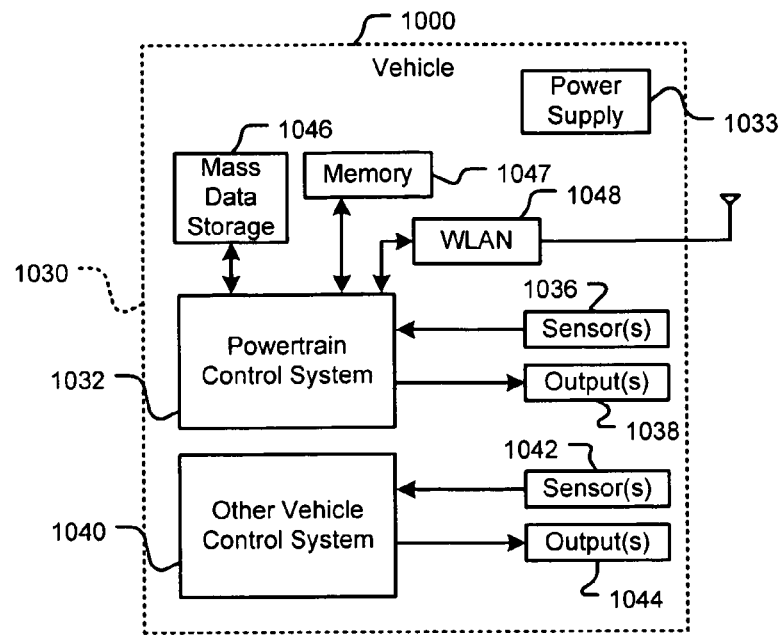
FIG. 10 is an illustrative block diagram of vehicle control systems that includes the disclosed VCO circuit in accordance with an embodiment of the invention.

FIG. 10 is an illustrative block diagram of a vehicle 1000 including control systems that include power monitor circuitry in accordance with an embodiment of the invention. In some implementations a powertrain control system 1032 receives inputs from one or more sensors 1036 such as temperature sensors, pressure sensors, rotational sensors, airflow sensors and/or any other suitable sensors and/or that generates one or more output control signals such as engine operating parameters, transmission operating parameters, and/or other control signals.

Other control systems 1040 of the vehicle 1000 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 5 and/or at least one DVD may have the configuration shown in FIG. 8. The HDD may be a mini HDD that includes one or more platters having a diameter that is smaller than approximately 1.8 inches. The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 11:
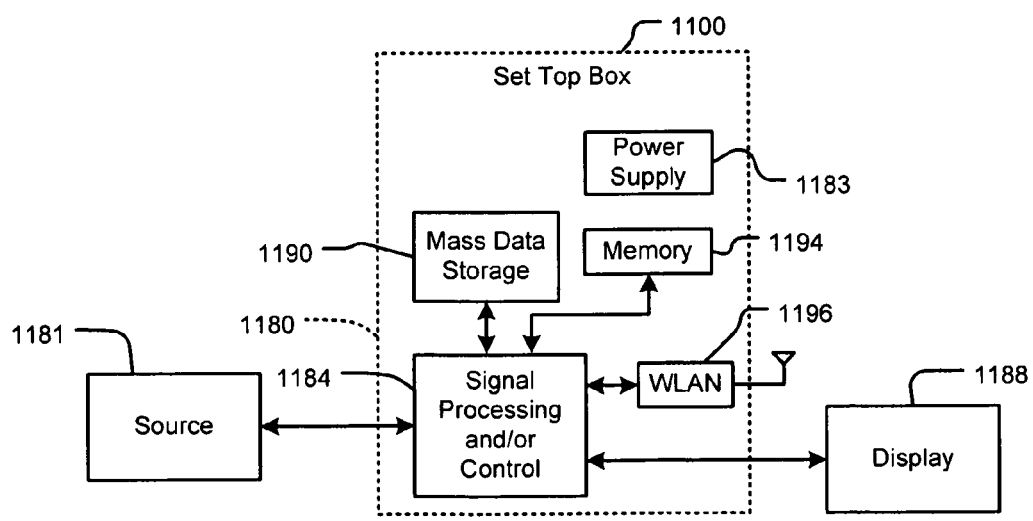
FIG. 11 is an illustrative block diagram of a set top box that includes the disclosed VCO circuit in accordance with an embodiment of the invention.

FIG. 11 is an illustrative block diagram of a set top box 1100 that includes the disclosed VCO circuit in accordance with an embodiment of the invention. The disclosed VCO circuit may be implemented in either or both signal processing and/or control circuits 1184, a WLAN interface 1196, mass data storage 1190 and/or a power supply 1183. The set top box 1100 receives signals from a source 1181 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1100 may process data, perform coding and/or encryption, perform calculations, format data and/or perform any other set top box function.

The set top box 1100 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 5 and/or at least one DVD may have the configuration shown in FIG. 8. The HDD may be a mini HDD that includes one or more platters having a diameter that is smaller than approximately 1.8 inches. The set top box 1100 may be connected to memory 1194 such as RAM, ROM, low latency nonvolatile memory such as flash memory and/or other suitable electronic data storage. The set top box 1100 also may support connections with a WLAN via a WLAN network interface 1196.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. An oscillator circuit comprising:
 a first pair of cross-coupled transistors having a first metal oxide semiconductor (MOS) transistor and a second MOS transistor;
 a second pair of cross-coupled transistors having a third MOS transistor and a fourth MOS transistor, wherein a first pair of control terminals of the first MOS and third MOS transistors are coupled together, and a second pair of control terminals of the second MOS and fourth MOS transistors are coupled together;
 a first inductor in communication with the first pair of control terminals of the first MOS and third MOS transistors and a second pair of output terminals of the second MOS and fourth MOS transistors;
 a second inductor in communication with the second pair of control terminals of the second MOS and fourth MOS transistors and a first pair of output terminals of the first MOS and third MOS transistors; and
 a tank circuit at least one of coupled between the first pair of control terminals and the first pair of output terminals and coupled between the second pair of control terminals and the second pair of output terminals, wherein the tank circuit comprises a tank inductor and a variable capacitor.

2. The oscillator circuit of claim 1 further comprising:
 a first voltage source coupled to a first reference voltage terminal of the oscillator circuit for supplying power to the oscillator circuit; and
 a second voltage source coupled to a second reference voltage terminal of the oscillator circuit, wherein the second voltage source has a lower voltage differential than the first voltage source.

3. The oscillator circuit of claim 1 further comprises:
 one or more control inputs for controlling at least one of the first inductor, the second inductor, the tank inductor and the variable capacitor.

4. The oscillator circuit of claim 1 further comprising:
a first pair of output terminals of the first MOS and third MOS transistors for driving a first output signal; and
a second pair of output terminals of the second MOS and fourth MOS transistors for driving a second output signal,
wherein the first output signal and the second output signal are approximately 180 degrees out of phase.

5. The oscillator circuit of claim 1, wherein the inductance of the first and second inductors are independently adjustable.

6. The oscillator circuit of claim 1, wherein the tank inductor and the variable capacitor are independently adjustable, and wherein the tank inductor and the variable capacitor are coupled to each other in parallel.

7. The oscillator circuit of claim 1, wherein relative directions of induced voltages during an AC half-cycle at the first inductor, the second inductor, and the tank inductor are respectively:
high at the control terminal of the first transistor and low at the output terminal of the second transistor,
high at the control terminal of the second transistor and low at the output terminal of the first transistor, and
high at the first inductor and low at the second inductor.

8. The oscillator circuit of claim 1, wherein the variable capacitor is a varactor.

9. The oscillator circuit of claim 1, wherein:
the first MOS transistor is a PMOS transistor;
the second MOS transistor is a PMOS transistor;
the third MOS transistor is an NMOS transistor; and
the fourth MOS transistor is an NMOS transistor.

10. The oscillator circuit of claim 1 wherein said first inductor is coupled between said first pair of control terminals and said second pair of output terminals.

11. The oscillator circuit of claim 1 wherein said second inductor is coupled between said second pair of control terminals and said first pair of output terminals.

12. The oscillator circuit of claim 1 wherein said tank circuit is coupled in series with and between said first inductor and said second inductor.

13. An oscillator circuit comprising:
a pair of cross-coupled transistors, including a first transistor and a second transistor;
a first inductor in communication with a control terminal of the first transistor and an output terminal of the second transistor;
a second inductor in communication with a control terminal of the second transistor and an output terminal of the first transistor; and
a tank circuit in communication with the first inductor and the second inductor, wherein the tank circuit comprises a tank inductor and a variable capacitor,
wherein outputs of the first and second transistors are outputs of the oscillator circuit, and
wherein said tank circuit is at least one of coupled between the control terminal of the first transistor and the output terminal of the second transistor and coupled between the control terminal of the second transistor and the output terminal of the first transistor.

14. The oscillator circuit of claim 13 further comprising:
a first reference current source coupled to the output terminal of the first transistor; and
a second reference current source coupled to the output terminal of the second transistor.

15. The oscillator circuit of claim 13 further comprising:
a first voltage source coupled to a first reference voltage terminal of the oscillator circuit for supplying power to the oscillator circuit; and
a second voltage source coupled to a second reference voltage terminal of the oscillator circuit, wherein the second voltage source has a lower voltage differential than the first voltage source.

16. The oscillator circuit of claim 13 further comprises:
one or more control inputs for controlling at least one of the first inductor, the second inductor, the tank inductor and the variable capacitor.

17. The oscillator circuit of claim 13 further comprising:
a first output terminal of the first transistor for driving a first output signal; and
a second output terminal of the second transistor for driving a second output signal,
wherein the first output signal and the second output signal are approximately 180 degrees out of phase.

18. The oscillator circuit of claim 13, wherein the inductance of the first and second inductors are independently adjustable.

19. The oscillator circuit of claim 13, wherein the tank inductor and the variable capacitor are independently adjustable, and wherein the tank inductor and the variable capacitor are coupled to each other in parallel.

20. The oscillator circuit of claim 13, wherein the first and second transistor are selected from the group consists of field-effect transistors, metal oxide semiconductor transistors, and bipolar transistors.

21. The oscillator circuit of claim 13, wherein relative directions of induced voltages during an AC half-cycle at the first inductor, the second inductor, and the tank inductor are respectively:
high at the control terminal of the first transistor and low at the output terminal of the second transistor,
high at the control terminal of the second transistor and low at the output terminal of the first transistor, and
high at the first inductor and low at the second inductor.

22. The oscillator circuit of claim 13, wherein the variable capacitor is a varactor.

23. A method for operating an oscillator circuit having a first transistor and a second transistor forming a cross-coupled pair of transistors, comprising:
coupling a first inductor between a control terminal of the first transistor and an output terminal of the second transistor;
coupling a second inductor between a control terminal of the second transistor and an output terminal of the first transistor;
coupling a tank circuit between the first inductor and the second inductor, wherein the tank circuit comprises a tank inductor and a variable capacitor, and wherein the tank circuit enables a first mutual inductance between the first inductor and the tank inductor, and enables a second mutual inductance between the tank inductor and the second inductor, and
directly coupling at least one of a supply voltage and a source current to input terminals of the first and second transistors.

24. The method of claim 23 further comprising:
coupling a first voltage source to a first reference voltage terminal of the oscillator circuit for supplying power to the oscillator circuit;
coupling a second voltage source to a second reference voltage terminal of the oscillator circuit, wherein the second voltage source has a lower voltage differential than the first voltage source;

coupling a first reference current source to the output terminal of the first transistor; and coupling a second reference current source to the output terminal of the second transistor.

25. The method of claim 24 further comprising:

adjusting inductance values of the first inductor, the second inductor, the tank inductor, and capacitance values of the variable capacitor to obtain a desired phase noise level at a particular resonance frequency of the oscillator circuit.

26. The method of claim 24 further comprising:

generating a first output signal by the oscillator circuit at a first output terminal of the first transistor; and generating a second output signal by the oscillator circuit at a second output terminal of the second transistor, wherein the first output signal and the second output signal are approximately 180 degrees out of phase.

27. The method of claim 23 comprising coupling the tank circuit directly between oscillator output terminals of the oscillator circuit.

28. The method of claim 23 wherein outputs of the first and second transistors are outputs of the oscillator circuit.

29. A system for generating a pair of differential output signals with an oscillating circuit having a first transistor and a second transistor forming a cross-coupled pair of transistors, comprising:

a first inductive means for inductively coupling a control terminal of the first transistor to an output terminal of the second transistor;

a second inductive means for inductively coupling a control terminal of the second transistor to an output terminal of the first transistor; and a third inductive means for inductively coupling the first inductive means to the second inductive means, wherein the third inductive means enables mutual inductances between the first inductive means and the second inductive means, and wherein a power source is directly coupled to output terminals of said first and second transistors.

30. The system of claim 29 further comprising:

means for supplying power to the oscillator circuit;

means for producing a voltage differential across the oscillator circuit;

means for supplying a first reference current to the output terminal of the first transistor; and means for supplying a second reference current to the output terminal of the second transistor.

31. The system of claim 30 further comprising:

means for adjusting the mutual inductances between the first inductive means, the second inductive means, and the third inductive means respectively to obtain a desired phase noise level at a particular resonance frequency of the oscillator circuit.

32. The system of claim 30 further comprising:

means for generating a first output signal of the oscillator circuit; and means for generating a second output signal of the oscillator circuit, wherein the first output signal and the second output signal are approximately 180 degrees out of phase.

33. The system of claim 29 wherein said third inductive means is not coupled to input terminals of the first and second transistors.

34. A method for operating an oscillator circuit having a first transistor and a second transistor forming a cross-coupled pair of transistors, comprising:

coupling a first inductor between a control terminal of the first transistor and an output terminal of the second transistor;

coupling a second inductor between a control terminal of the second transistor and an output terminal of the first transistor;

coupling a tank circuit between the first inductor and the second inductor, wherein the tank circuit comprises a tank inductor and a variable capacitor and wherein the tank circuit enables a first mutual inductance between the first inductor and the tank inductor, and enables a second mutual inductance between the tank inductor and the second inductor;

directly coupling at least one of a supply voltage and a source current to input terminals of the first and second transistors; and coupling the first and second inductors and the tank inductor directly in series.

* * * * *

UNITED STATES PATENT AND TRADEMARK OFFICE
CERTIFICATE OF CORRECTION

PATENT NO. : 7,362,192 B1  Page 1 of 1
APPLICATION NO. : 11/282342
DATED : April 22, 2008
INVENTOR(S) : Li Lin et al.

It is certified that error appears in the above-identified patent and that said Letters Patent is hereby corrected as shown below:

| | |
|---|---|
| Column 3, Line 60 | Delete "HDTB" and insert -- HDTV -- |
| Column 4, Line 41 | Delete "$M_{N1}$" and insert -- $M_{N0}$ -- |
| Column 4, Line 43 | Delete "L" and insert -- $L_1$ -- after "inductor" |
| Column 4, Line 47 | Delete "$M_{N1}$" and insert -- $M_{N0}$ -- |
| Column 5, Line 53 | Delete "$M_{N1}$" and insert -- $M_{N0}$ -- |
| Column 5, Line 60 | Delete second occurrence of "$M_{N1}$" and insert -- $M_{N0}$ -- |
| Column 8, Line 57 | Delete "HDTB" and insert -- HDTV -- |
| Column 12, Line 28 Claim 20 | Delete "consists" and insert -- consisting -- |

Signed and Sealed this

Second Day of September, 2008

JON W. DUDAS
*Director of the United States Patent and Trademark Office*